United States Patent [19]

Macomber et al.

[11] Patent Number: 5,238,531
[45] Date of Patent: Aug. 24, 1993

[54] APPARATUS AND METHOD FOR FABRICATING A CHIRPED GRATING IN A SURFACE EMITTING DISTRIBUTED FEEDBACK SEMICONDUCTOR LASER DIODE DEVICE

[75] Inventors: Steven H. Macomber, Bethel, Conn.; Jeffrey S. Mott, Shenorock, N.Y.

[73] Assignee: Hughes Aircraft Company, Los Angeles, Calif.

[21] Appl. No.: 822,253

[22] Filed: Jan. 17, 1992

[51] Int. Cl.⁵ .................. H01L 21/306; B44C 1/22
[52] U.S. Cl. ............................ 156/643; 156/651; 156/655; 156/659.1; 156/345; 156/662; 219/121.6; 219/121.69; 372/50
[58] Field of Search ............. 156/643, 649, 654, 655, 156/659.1, 662, 651, 345; 219/121.6, 121.68, 121.69, 121.75, 121.85; 204/192.34, 298.36; 372/9, 50; 427/38, 53.1; 437/129

[56] References Cited

U.S. PATENT DOCUMENTS

| | | | |
|---|---|---|---|
| 4,701,995 | 10/1987 | Dolan et al. | 437/129 |
| 4,777,148 | 10/1988 | Liau et al. | 156/649 X |
| 4,838,987 | 6/1989 | Dobson | 156/649 X |

*Primary Examiner*—William A. Powell
*Attorney, Agent, or Firm*—Michael W. Sales; Wanda K. Denson-Low

[57] ABSTRACT

An apparatus 10 for exposing a chirped grating pattern of monochromatic light on a photoresist coated semiconductor wafer 12 includes an argon gas laser 14 that outputs a monochromatic light beam 16. This monochromatic light beam 16 is filtered and collimated to produce a monochromatic light beam with a planar wavefront 24. A portion of this planar wavefront passes through a cylindrical lens 26 and a first baffle slit 30, producing a cylindrical wavefront 34 that is incident upon a hypotenuse face 38 of a right angle prism 40. Another portion of the planar wavefront passes through a second baffle slit 32, producing a smaller planar wavefront 36 that is also incident upon the hypotenuse face 38 of the right angle prism 40. A destructive interference between a reflected cylindrical wavefront 92 and a direct planar wavefront 90 inside the prism 40 produces a chirped grating pattern of monochromatic light on an adjacent prism face 42. This chirped grating pattern of monochromatic light is projected toward the semiconductor wafer 12, thereby exposing the photoresist coated wafer surface 48 with the chirped grating pattern.

26 Claims, 1 Drawing Sheet

APPARATUS AND METHOD FOR FABRICATING A CHIRPED GRATING IN A SURFACE EMITTING DISTRIBUTED FEEDBACK SEMICONDUCTOR LASER DIODE DEVICE

BACKGROUND OF THE INVENTION

1. Field of the Invention

The present invention relates to methods for fabricating integrated circuits and, more particularly, to an apparatus and method for fabricating a chirped grating in a surface emitting distributed feedback semiconductor laser diode device.

2. Description of the Prior Art

Since the early 1970's, surface emitting laser diode devices with a variety of different waveguide grating structures have been explored. Of those explored, the distributed Bragg reflector (DBR) and the distributed feedback (DFB) devices have attracted the most interest. DBR laser devices have gratings at the ends of a pumped region to provide a feedback of photon radiation back into the pumped region. DFB laser devices have a continuous grating along one side of a pumped region to provide a feedback of photon radiation back into the pumped region. To date, mainly DBR devices have been demonstrated. However, due to a high thermal resistance from a substrate side heat sink bonding configuration, these devices have had to be operated in a pulsed mode. More recently, DFB devices have been demonstrated. These devices offer the promise of reliable high-power continuous wave operation due to an epitaxial side heat sink bonding configuration design.

To date, surface emitting distributed feedback semiconductor laser devices have been fabricated with a second order, constant periodicity grating etched into a cladding layer surface of a semiconductor wafer. This type of grating can be fabricated by creating an optical standing wave on a photoresist coated wafer surface using two beam interference. The wafer is then treated with an ion milling process and a chemical etching process to transfer the photoresist exposed grating pattern into the cladding layer surface of the semiconductor wafer.

Devices with second order, constant periodicity gratings allow photon radiation, originating in an electrically pumped region, to be deflected from the grating surface back into the pumped region through second order diffraction. This second order diffracted photon radiation is deflected in two opposite directions, each direction being normal from one side of a grating groove. Due to the constant periodicity of the grating, the amplitudes of these oppositely directed photon fields are antisymmetric to one another about a center of the grating surface. The opposition field direction allows for their destructive interference. The antisymmetry of the amplitudes of these fields produces a total destructive interference at the center of the grating surface and a corresponding antisymmetric superposition of these fields about this grating surface center. This antisymmetric superposition of oppositely directed, second order diffracted photon fields results in a device output beam that exhibits an antisymmetric, longitudinal mode near-field output intensity profile and a corresponding symmetric, double-lobed longitudinal mode far-field output intensity profile, all symmetries being about the center of the grating surface.

Surface emitting distributed feedback semiconductor laser devices provide significant advantages over DBR devices because of their ability to operate in a continuous wave mode at high power. However, destructive interference of second order diffracted photon radiation reduces the power efficiency of these DFB devices. Also, the output beam intensity is split between two far-field lobes. It is therefore desirable to increase the power efficiency of these devices while concentrating the output beam intensity into a single far-field lobe.

SUMMARY OF THE INVENTION

The present invention contemplates a means for fabricating a chirped grating in a surface emitting distributed feedback semiconductor laser device. The term chirp refers to a grating spacing that is not constant. The method of fabricating this chirped grating begins by applying photoresist to one surface of a positively doped cladding layer of a semiconductor wafer. The photoresist coated wafer surface is then optically contacted to an adjacent face of a right angle prism with index matching fluid. A two-slit baffle is placed in front of the hypotenuse face of the right angle prism such that a line normal to the hypotenuse face intersects a center point between the two baffle slits and the right angle of the prism. Also, the lengths of the two slits are such that when added together the sum is less than the length of the hypotenuse face of the right angle prism.

A cylindrical lens is placed in front of one of the baffle slits on the baffle side opposite of the prism. A collimated light beam is directed perpendicular to the two-slit baffle and cylindrical lens arrangement. A portion of the collimated beam passes through the cylindrical lens and the one baffle slit to produce a cylindrical wavefront that is incident upon a portion of the hypotenuse face of the prism. Another portion of the collimated beam passes through the other baffle slit allowing a planar wavefront to be incident on another portion of the hypotenuse face of the prism. A destructive interference inside the prism between these cylindrical and planar wavefronts creates a chirped grating pattern that is exposed on the photoresist coated wafer surface. Once exposed, the wafer is treated with an ion milling process and a wet chemical etching process to produce a desired grating profile depth and a smooth grating surface, respectively.

The inclusion of this chirp in the grating surface enables the laser device to produce a nearly single-lobed longitudinal mode far-field output beam intensity profile and an increased power efficiency over devices that contain unchirped, constant periodicity gratings. A detailed description of how a chirped grating surface emitting distributed feedback semiconductor laser device achieves these results is included in the related and co-pending patent application Ser. No. 07/822,269, entitled, Chirped Grating Surface Emitting Distributed Feedback Semiconductor Laser, filed on the same date as the present application.

A primary objective of the present invention is to provide a method for fabricating a chirped grating in a surface emitting distributed feedback semiconductor laser device.

Another objective of the present invention is to provide a chirped grating in a surface emitting distributed feedback semiconductor laser device such that the device produces a nearly single-lobed longitudinal mode far-field output beam intensity profile.

Another objective of the present invention is to provide a chirped grating in a surface emitting distributed feedback semiconductor laser device such that the device exhibits an increased power efficiency over that of surface emitting distributed feedback semiconductor laser devices with unchirped gratings.

DETAILED DESCRIPTION OF THE INVENTION

Figure 1:
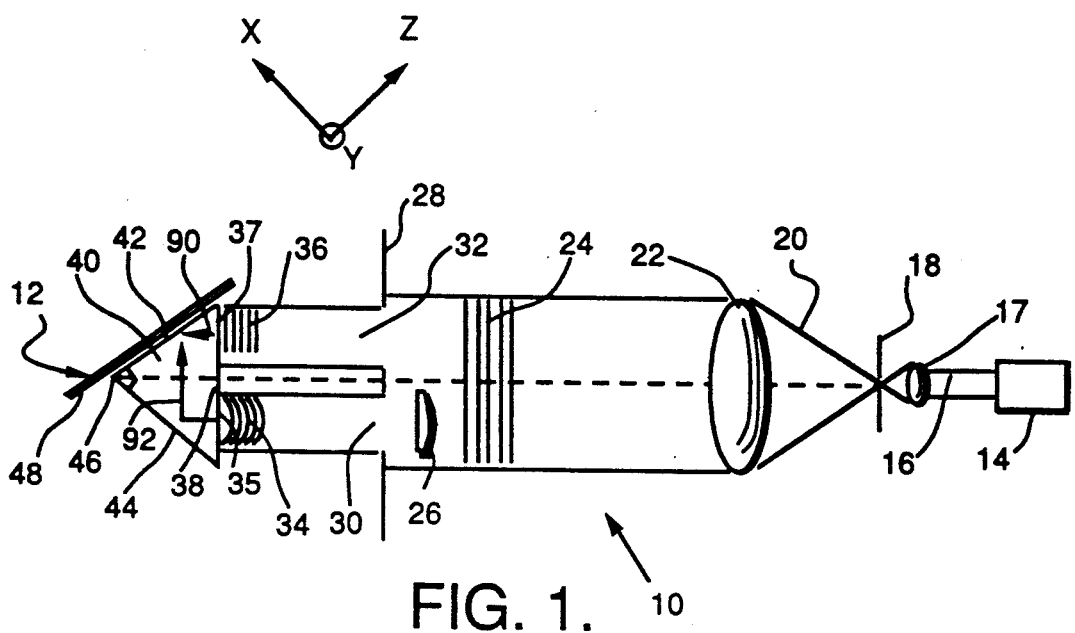
FIG. 1 is a schematic representation of an apparatus that exposes a chirped grating pattern onto a semiconductor wafer surface.

Referring FIG. 1, there is shown an apparatus 10 that exposes a chirped grating pattern of monochromatic light on a photoresist coated semiconductor wafer 12. The term chirp refers to a grating spacing that is not constant. This apparatus 10 includes an argon gas laser 14 that outputs a monochromatic light beam 16 at a wavelength of 4880 Å, approximately 1 mm in diameter. This monochromatic light beam 16 is expanded and filtered using a standard spatial filtering scheme comprising a microscope objective lens 17 and a pinhole plate 18. This spatial filtering scheme produces a diverging beam 20 that is passed through a collimator lens 22 whereby a monochromatic light beam with a planar wavefront 24 is produced.

A cylindrical lens 26 is placed in front of one slit 30 of a two-slit baffle 28. A portion of the planar wavefront passes through the cylindrical lens 26 so as to produce a cylindrical wavefront 34 that passes through the baffle slit 30. Another portion of the planar wavefront passes through a second baffle slit 32 to produce a smaller diameter planar wavefront 36. The two-slit baffle 28 is placed in front of a hypotenuse face 38 of a right angle prism 40 such that the cylindrical wavefront 34 is incident upon one area 35 of the hypotenuse face and the planar wavefront 36 is incident upon another area 37 of the hypotenuse face. It should be noted that the cylindrical lens 26 may be placed in front of either baffle slit 30, 32. It should also be noted that the cylindrical lens 26 may be either converging or diverging in nature.

Inside the right angle prism 40, the cylindrical wavefront is reflected from a first adjacent prism face 44. This reflected cylindrical wavefront 92 destructively interferes with an unreflected planar wavefront 90, thereby creating a grating pattern of monochromatic light on a second adjacent prism face 42. This grating pattern has a linearly varying grating spacing, or chirp. This chirped grating pattern of monochromatic light is projected through the second adjacent prism face 42 toward the semiconductor wafer 12. It should be noted that since the cylindrical lens 26 may be placed in front of either baffle slit 30, 32, either the cylindrical wavefront 92 or the planar wavefront 90 may be the reflected wavefront or the unreflected wavefront as described above, respectively.

Figure 2:
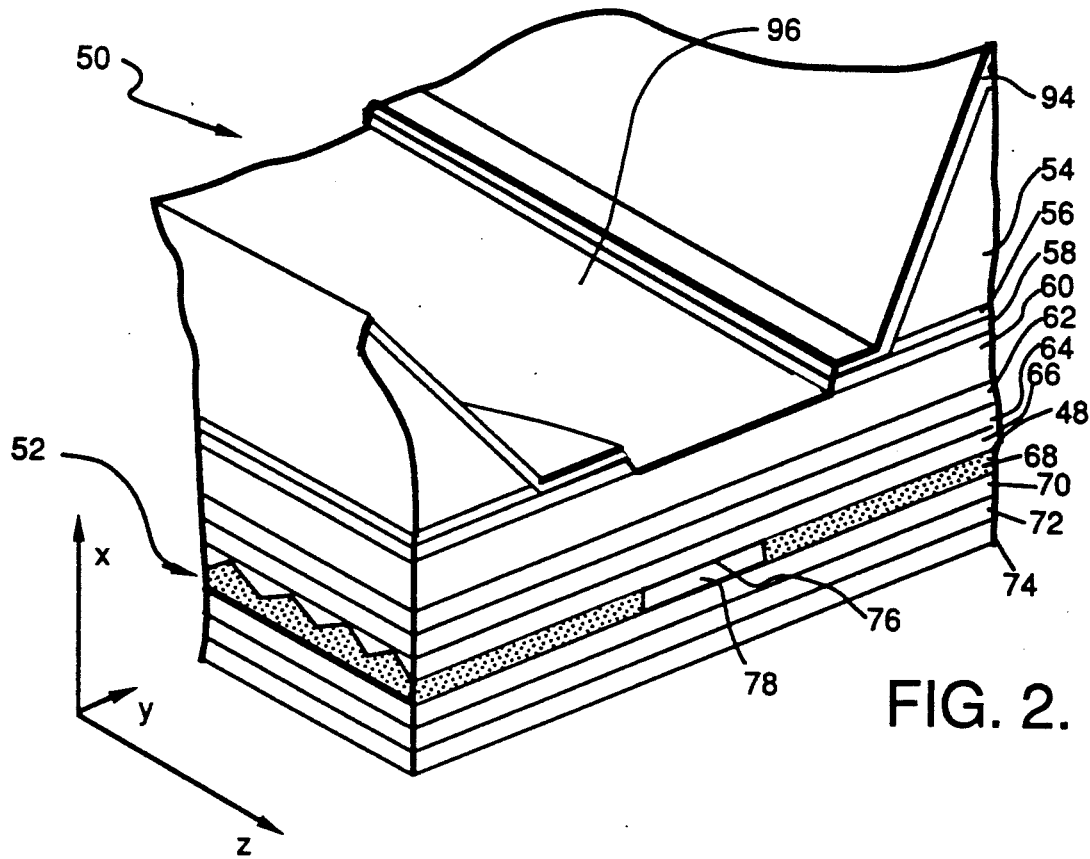
FIG. 2 is a cross-sectional plan view of a chirped grating surface emitting distributed feedback semiconductor laser diode device structure.

Referring the FIG. 2, there is shown a cross-sectional plan view of a surface emitting distributed feedback semiconductor laser device structure 50 with a second order chirped grating 52. This laser diode device 50 is fabricated on a negatively (N) doped gallium and arsenic material compound (GaAs) substrate 54. Many epitaxial layers are grown on this substrate 54 including a stop-etch layer 56, an N-doped GaAs layer 58, an N-doped aluminum, gallium, and arsenic material compound (AlGaAs) cladding layer 60, an N-doped AlGaAs confinement layer 62, an AlGaAs active layer 64, and a thin, positively (P) doped AlGaAs cladding layer 66. The surface of the P-doped AlGaAs cladding layer 48 is where the chirped grating pattern is exposed.

Referring again to FIG. 1, the semiconductor wafer 12 consists of the GaAs substrate 54 and the epitaxial layers 56, 58, 60, 62, 64, 66 described above in FIG. 2. The orientation of this wafer 12 is indicated by the corresponding coordinate axes shown in these two figures. The surface of the P-doped AlGaAs cladding layer 48 is is coated with a 100 nm thick mask of photoresist and optically contacted to the second adjacent face 42 of the right angle prism 40 with an index matching fluid. This index matching fluid is applied between the photoresist coated wafer surface and the second adjacent prism face 46, and is used to inhibit reflections of light off the photoresist coated wafer surface 48 caused by light directed from the second adjacent prism face 42. By matching the index of refraction of the photoresist material to the index of refraction of the prism 40, this fluid serves to remove a refractive index interface at the photoresist coated wafer surface 48, thereby inhibiting reflections from this surface.

The chirped grating pattern projected from the second adjacent prism face 42 is exposed onto an area of the photoresist coated wafer surface 48, the size of this area being dependent upon the size of the prism 40. It has been described in *AlGaAs Surface-Emitting Distributed Feedback Laser*, Proceedings of the SPIE, 1988, that an optimal grating periodicity for a surface emitting distributed feedback semiconductor laser device with an unchirped grating and a AlGaAs active layer material is on the order of 0.24 μm. This optimal periodicity for an unchirped grating is used as a nominal grating spacing in the present linearly varying chirped grating.

Once exposed, the wafer surface is treated to an ion milling process to achieve a desired grating depth. This ion milling process consists of an atomic bombardment of the entire wafer surface 48 with accelerated argon ions. This broad area of bombardment results in a depth removal of AlGaAs material from the grating pattern exposed sections of the P-doped AlGaAs cladding layer 66. It has been described in *Analysis of Grating Surface Emitting Lasers*, IEEE Journal of Quantum Electronics, Volume 26, Number 3, March 1990, that an optimal grating depth for a surface emitting distributed feedback semiconductor laser device with an unchirped grating, an AlGaAs active layer material, and a 0.24 μm constant grating periodicity, is 100 nm. This optimal grating depth for an unchirped grating is also used in the present linearly varying chirped grating.

After the desired grating depth has been achieved through ion milling, the wafer is treated to a wet chemical etching process. This chemical etching process serves to remove any damage to the crystal lattice structure of the P-doped AlGaAs cladding layer 66 material caused by the atomic bombardment with the accelerated argon ions. Also, this chemical etching process smoothes the surface of the ion milled grooves of the grating. The result of these processes produce a second order grating surface with a linearly varying grating spacing, or a second order chirped grating.

Referring again to FIG. 2, once the chirped grating 52 is fabricated into the P-doped AlGaAs cladding layer 66, a dielectric mask of silicon dioxide ($SiO_2$) 68 is deposited over the grating surface for isolation and current confinement. A stripe 78 is etched into the $SiO_2$ layer 68 down to a surface of the grating 76, and gold (Au) metal is evaporated into this striped region 78 to serve as an ohmic contact for the P-side of the laser diode structure 50. Barrier metal layers of chromium (Cr) 70, platinum (Pt) 72, and gold 74 are deposited over the gold stripe 78 and $SiO_2$ 68 regions to provide a low thermal resistance in the negative X-axis direction.

The N-doped GaAs substrate 54 is coated with photoresist and optically patterned and etched using standard fabrication techniques to produce a well, exposing the N-doped GaAs epitaxial layer 58. A gold, germanium, and nickel material compound (AuGeNi) layer 94 is deposited and annealed in the well to serve as an ohmic contact for the N-side of the laser diode structure 50. Another photoresist mask is applied to the N-side contact 94 and an output window 96 is formed by standard pattern exposure and chemical etching techniques. This output window 96 allows a beam of photon radiation, deflected normal from the second order, gold-coated chirped grating surface 76 through first order diffraction, to exit the laser diode device 50.

As described in the prior art section, devices with second order, constant periodicity gratings produce an antisymmetric superposition of second order diffracted photon fields about a center of the grating surface. This antisymmetric superposition is caused by a destructive interference between two oppositely directed, second order diffracted photon fields whose amplitudes are antisymmetric to one another about the grating surface center. The antisymmetric superposition of second order diffracted photon fields results in a device output beam that exhibits an antisymmetric, longitudinal mode near-field output intensity profile and a corresponding symmetric, double-lobed longitudinal mode far-field output intensity profile.

The present invention, however, produces a non-uniform superposition of photon fields deflected from the second order, gold coated chirped grating surface 76 through second order diffraction. This non-uniform superposition of second order diffracted photon fields results in a device 50 output beam that exhibits a non-uniform, longitudinal mode near-field output intensity profile and a corresponding single-lobed longitudinal mode far-field output intensity profile. Additionally, the non-uniform superposition of second order diffracted photon fields allows a reduced destructive interference to occur between these fields, thereby increasing the device power efficiency.

It is thus seen that the objectives set forth above are efficiently attained and, since certain changes may be made in the above described apparatus and method without departing from the scope of the invention, it is intended that all matter contained in the above description or shown in the accompanying drawings shall be interpreted as illustrative and not in a limiting sense.

What is claimed is:

1. An apparatus for projecting a chirped grating pattern onto the surface of a material, said apparatus comprising:
    means for providing a planar wavefront of monochromatic light;
    means for providing a cylindrical wavefront of monochromatic light; and
    means for providing a destructive interference between said planar wavefront and said cylindrical wavefront, such that a chirped grating pattern of monochromatic light is formed from this interference and projected onto said material surface.

2. An apparatus as described in claim 1, wherein said means for providing a planar wavefront comprises:
    means for providing a monochromatic light beam;
    means for filtering said provided monochromatic light beam; and
    means for collimating said filtered monochromatic light beam.

3. An apparatus as described in claim 2, wherein said means for providing a monochromatic light beam is an argon gas laser.

4. An apparatus as described in claim 2, wherein said means for filtering is a spatial filter.

5. An apparatus as described in claim 4, wherein said spatial filter comprises:
    a microscope objective lens; and
    a plate having a pinhole.

6. An apparatus as described in claim 6, wherein said means for collimating said filtered monochromatic light beam is a collimator lens.

7. An apparatus as described in claim 1, wherein said means for providing a cylindrical wavefront comprises:
    means for providing a monochromatic light beam:
    means for filtering said provided monochromatic light beam:
    means for collimating said filtered monochromatic light beam; and
    means for focusing said collimated and filtered monochromatic light beam.

8. An apparatus as described in claim 7, wherein said means for providing a monochromatic light beam is an argon gas laser.

9. An apparatus as described in claim 7, wherein said means for filtering is a spatial filter.

10. An apparatus as described in claim 9, wherein said spatial filter comprises:
    a microscope objective lens; and
    a plate having a pinhole.

11. An apparatus as described in claim 7, wherein said means for collimating said filtered monochromatic light is a collimator lens.

12. An apparatus as described in claim 7, wherein said means for focusing said collimated and filtered monochromatic light beam is a converging lens.

13. An apparatus as described in claim 7, wherein said means for focusing said collimated and filtered monochromatic light beam is a diverging lens.

14. An apparatus as described in claim 1, wherein said means for providing a destructive interference comprises:
    a two-slit baffle; and
    a right angle prism.

15. An apparatus as described in claim 14, wherein said two-slit baffle is placed in front of a hypotenuse face of said right angle prism and wherein a portion of said planar wavefront passes through a first slit of said two-slit baffle and wherein a portion of said cylindrical wavefront passes through a second slit of said two-slit baffle, such that said passed planar wavefront is incident upon one area of said hypotenuse face and said passed cylindrical wavefront is incident upon one other area of said hypotenuse face.

16. An apparatus as described in claim 15, wherein said incident planar wavefront and said incident cylindrical wavefront destructively interfere inside said right angle prism and wherein said interference produces a chirped grating pattern on an adjacent prism face.

17. An apparatus as described in claim 16, wherein said chirped grating pattern is projected from an adjacent face of the right angle prism.

18. An apparatus as described in claim 17, wherein said adjacent prism face is optically contacted to said material surface.

19. An apparatus as described in claim 18, wherein said optical contact is made through an index matching fluid and wherein said index matching fluid is placed between said adjacent prism face and said material surface.

20. An apparatus as described in claim 19, wherein said material surface is a photoresist coated semiconductor wafer surface.

21. A method for fabricating a chirped grating in a material surface, said method comprising the steps of:
   irradiating a first area of a hypotenuse face of a right angle prism with a planar wavefront;
   irradiating a second area of said hypotenuse face of a right angle prism with a cylindrical wavefront; and
   optically contacting said material surface to an adjacent face of said right angle prism, such that a chirped grating pattern is formed from a destructive interference between said planar wavefront and said cylindrical wavefront and projected onto said material surface.

22. A method as described in claim 21, wherein said step of irradiating with a planar wavefront includes the substeps of:
   providing a monochromatic light beam;
   filtering said monochromatic light beam;
   collimating said filtered monochromatic light beam; and
   directing said collimated and filtered monochromatic light beam onto said first area of the hypotenuse face of the right angle prism.

23. A method as described in claim 21, wherein said step of irradiating with a cylindrical wavefront includes the substeps of:
   providing a monochromatic light beam;
   filtering said monochromatic light beam;
   collimating said filtered monochromatic light beam;
   focusing said collimated and filtered monochromatic light beam; and
   directing said focused, collimated and filtered monochromatic light beam onto said second area of the hypotenuse face of the right angle prism.

24. A method as described in claim 21, whereby said step of optically contacting the material surface to the adjacent prism face includes the step of applying an index matching fluid between said material surface and said adjacent prism face.

25. A method as described in claim 21, additionally including the step of applying a coating of photoresist to said material surface before optically contacting the surface.

26. A method as described in claim 21, additionally including the steps of:
   milling said material surface where said chirped grating pattern is projected; and
   etching said milled material surface to remove damaged material and to provide a smooth grating surface.

* * * * *